United States Patent
Ou et al.

(10) Patent No.: US 7,795,673 B2
(45) Date of Patent: Sep. 14, 2010

(54) VERTICAL NON-VOLATILE MEMORY

(75) Inventors: Tien-Fan Ou, Hsinchu (TW); Wen-Jer Tsai, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 11/781,423

(22) Filed: Jul. 23, 2007

(65) Prior Publication Data

US 2009/0026460 A1    Jan. 29, 2009

(51) Int. Cl.
  *H01L 23/62* (2006.01)
(52) U.S. Cl. .................. 257/331; 257/E29.309
(58) Field of Classification Search .................. 257/324, 257/E29.309, 314, 315, 329, 330, 331; 438/212, 438/268
See application file for complete search history.

(56) References Cited

U.S. PATENT DOCUMENTS

| | | | | |
|---|---|---|---|---|
| 5,834,793 A * | 11/1998 | Shibata | .................. | 257/25 |
| 5,909,618 A * | 6/1999 | Forbes et al. | .................. | 438/242 |
| 5,936,274 A * | 8/1999 | Forbes et al. | .................. | 257/315 |
| 6,072,209 A * | 6/2000 | Noble et al. | .................. | 257/296 |
| 6,344,390 B1 | 2/2002 | Bostelmann et al. | | |
| 6,344,673 B1 | 2/2002 | Aussilhou et al. | | |
| 6,424,001 B1 * | 7/2002 | Forbes et al. | .................. | 257/315 |
| 6,462,387 B1 * | 10/2002 | Lai | .................. | 257/390 |
| 6,486,028 B1 * | 11/2002 | Chang et al. | .................. | 438/259 |
| 6,639,268 B2 * | 10/2003 | Forbes et al. | .................. | 257/315 |
| 6,686,604 B2 | 2/2004 | Layman et al. | | |
| 6,943,407 B2 | 9/2005 | Ouyang et al. | | |
| 6,979,857 B2 * | 12/2005 | Forbes | .................. | 257/314 |
| 7,056,783 B2 | 6/2006 | Layman et al. | | |
| 7,511,332 B2 * | 3/2009 | Yang | .................. | 257/316 |
| 2003/0211701 A1 * | 11/2003 | Desko et al. | .................. | 438/424 |
| 2004/0157353 A1 | 8/2004 | Ouyang et al. | | |
| 2005/0208769 A1 * | 9/2005 | Sharma | .................. | 438/700 |
| 2006/0163631 A1 | 7/2006 | Chen et al. | | |
| 2006/0261401 A1 * | 11/2006 | Bhattacharyya | .................. | 257/316 |
| 2007/0045709 A1 * | 3/2007 | Yang | .................. | 257/315 |
| 2007/0051996 A1 | 3/2007 | Chen et al. | | |
| 2007/0099381 A1 * | 5/2007 | Walker | .................. | 438/262 |
| 2007/0158731 A1 * | 7/2007 | Bae et al. | .................. | 257/314 |
| 2007/0161193 A1 * | 7/2007 | Hsu et al. | .................. | 438/259 |
| 2008/0117677 A1 * | 5/2008 | Ou et al. | .................. | 365/185.03 |

* cited by examiner

*Primary Examiner*—Minh-Loan T Tran
*Assistant Examiner*—Vongsavanh Sengdara
(74) *Attorney, Agent, or Firm*—J.C. Patents

(57) ABSTRACT

A manufacturing method of a vertical non-volatile memory is provided. A first semiconductor layer, a first barrier, a second semiconductor layer, a second barrier and a third semiconductor layer are formed on a substrate sequentially. The first and the third semiconductor layers have a first conductive state, while the second semiconductor layer has a second conductive state. Several strips of active stacked structures are formed by removing portions of the first, second and third semiconductor layers, and portions of the first and second barrier on the substrate. After forming a storage structure on the substrate, the storage structure is covered with a conductive layer filling spaces among the active stacked structures. A portion of the conductive layer is removed to form word lines across the active stacked structures.

24 Claims, 9 Drawing Sheets

VERTICAL NON-VOLATILE MEMORY

BACKGROUND OF THE INVENTION

1. Field of the Invention

The present invention is related to a vertical non-volatile memory and a manufacturing method thereof. More particularly, the invention is related to a vertical non-volatile memory which can prevent dopant from diffusing and a method of manufacturing the same.

2. Description of Related Art

The non-volatile memory is a memory that can retain stored data after its power supply is shut down. Nowadays, the manufacturing method of the non-volatile read-only memory is mostly forming a trapping layer constituted of oxide-nitride-oxide (ONO) first. A memory adopting an ONO layer as the trapping layer is called a trapping layer memory. Afterwards, a poly-silicon gate is formed on the ONO layer, and finally a source region and a drain region are formed at the two sides of the ONO layer on a substrate.

However, as the size of components gets smaller, the trapping layer in the trapping layer memory also gets narrower. Consequently, charges stored in different bit positions are drawn closer such that the reliability is reduced. Accordingly, a vertical non-volatile memory is developed. A vertical non-volatile memory is constituted of several stacked semiconductor layers fabricated as a vertical source, a vertical drain and a vertical channel region. An ONO layer served as a trapping layer covers a top surface of the stacked semiconductor layers, and lastly word lines are used as a control gate. Thus, more non-volatile memories can be manufactured within a limited area.

However, since the source, the drain and the channel region are adjacent to one another in the vertical non-volatile memory, dopant diffusion tends to happen in junctions among the source, the drain and the channel region in a subsequent thermal treatment so as to change the sizes of the source, the drain and/or the channel region.

SUMMARY OF THE INVENTION

The present invention is directed to a vertical non-volatile memory having a vertical active stacked structure including barriers so as to control junction locations.

The invention is further directed to a manufacturing method of a vertical non-volatile memory. A vertical non-volatile memory can be easily formed in the manufacturing method and improper diffusion of dopant can thus be prevented.

The invention is directed to a vertical non-volatile memory including a substrate, a plurality of strips of active stacked structures, a plurality of word lines and a storage structure layer. The active stacked structures are disposed on the substrate in parallel to a first direction. Each of the active stacked structures includes a first, a second, a third semiconductor layer and a first and a second barriers. The first semiconductor layer is disposed on the substrate; the second semiconductor layer is disposed on the first semiconductor layer; the third semiconductor layer is disposed on the second semiconductor layer; the first barrier is disposed between the first and the second semiconductor layers and the second barrier is disposed between the second and the third semiconductor layers. The first and the third semiconductor layers have a first conductive state, whereas the second semiconductor layer has a second conductive state. The word lines are arranged in parallel to a second direction. Each of the word lines crosses the active stacked structure and fills spaces among the active stacked structures. The storage structure is disposed between the word lines and the active stacked structures.

According to one embodiment of the invention, the first barrier is a thin film, and a material thereof is, for example, oxide, nitride or oxynitride.

According to one embodiment of the invention, a thickness of the first barrier is about 10-20 angstroms.

According to one embodiment of the invention, the second barrier is a thin film, and a material thereof is, for example, oxide, nitride or oxynitride.

According to one embodiment of the invention, a thickness of the second barrier is about 10-20 angstroms.

According to one embodiment of invention, the first semiconductor layer/the second semiconductor layer/the third semiconductor layer is, for example, N+/P/N+ doped layer, P+/N/P+ doped layer or SiGe/Si/SiGe layer.

In one embodiment of the invention, the first semiconductor layer, the second semiconductor layer and the third semiconductor layer are, for example, poly-silicon layers.

In one embodiment of the invention, the first conductive state can be N-type, and the second conductive state can be P-type. Alternatively, the first conductive state is P-type and the second conductive state is N-type.

In one embodiment of the invention, the storage structure includes a first dielectric layer, a storage layer and a second dielectric layer. The first dielectric layer covers a surface of the active stacked structures; the storage layer covers the first dielectric layer and the second dielectric layer covers the storage layer. Moreover, the storage layer may be a charge-trapping layer, a floating gate or a nano-crystal. A material of the charge-trapping layer may be silicon nitride or a high dielectric constant material. A material of the nano-crystal may be silicon, germanium or metal nano-crystal.

In one embodiment of the invention, the first dielectric layer/the storage layer/the second dielectric layer in the storage structure may be oxide-nitride-oxide (ONO).

In one embodiment of the invention, the storage structure includes a first oxide layer (O1), a first nitride layer (N1), a second oxide layer (O2), a second nitride layer (N2) and a third oxide layer (O3) covering the active stacked structures orderly. Thicknesses of the first and the second oxide layers and the first nitride layer are independently less than 2 nm, for example, and preferably, the thickness of the first oxide layer (O1) is between 0.5 nm and 2 nm, and the thickness of the first nitride layer (N1) is between 1 nm and 2 nm, and the thickness of the second oxide layer (O2) is between 1.5 nm and 2 nm. More preferably, the thickness of the first oxide layer (O1) is less than 1.5 nm.

In one embodiment of the invention, a material of the word lines is, for example, doped poly-silicon, metal silicide, ruthenium (Ru), molybdenum (Mo) or wolfram (W).

According to one embodiment of the invention, the substrate may be a silicon substrate, a silicon oxide substrate or a silicon nitride substrate.

A manufacturing method of a vertical non-volatile memory includes forming a first semiconductor layer on a substrate. The first semiconductor layer has a first conductive state. Next, a first barrier is formed on the first semiconductor layer, and a second semiconductor layer is further formed on the first barrier. The second semiconductor layer has the second conductive state. Thereafter, a second barrier is formed on the second semiconductor layer, and a third semiconductor layer is further formed on the second barrier. The third semiconductor layer has the same first conductive state as the first semiconductor layer. Afterwards, portions of the third semiconductor layer, the second barrier, the second semiconductor layer, the first barrier and the first semiconductor layer are removed sequentially so as to form a plurality of strips of active stacked structures. Next, a storage structure is formed on the substrate to cover the surface of the active stacked structure. Afterwards, a conductive layer is formed on the substrate to cover the storage structure and fill spaces among the active stacked structures. Then, a portion of the conductive layer is removed to form a plurality of word lines crossing the active stacked structures.

According to another embodiment of the invention, a method of forming the first semiconductor layer is, for example, depositing a high dosage N-type poly-silicon layer (an N+ poly Si layer).

According to another embodiment of the invention, a method of forming the second semiconductor layer includes first depositing a poly-silicon layer and then injecting P-type dopant into the poly-silicon layer.

According to another embodiment of the invention, a method of forming the third semiconductor layer is, for example, depositing a high dosage N-type poly-silicon layer.

According to another embodiment of the invention, a method of forming the active stacked structure is, for example, forming a pad oxide layer on the third semiconductor layer first, and then forming a hard mask layer on the pad oxide layer. Next, a plurality of strips of active stacked structure regions is defined in the hard mask layer using a photolithographic process and an etching process so as to expose a portion of the pad oxide layer. Finally, portions of the pad oxide layer, the third semiconductor layer, the second barrier, the second semiconductor layer, the first barrier and the first semiconductor layer are removed sequentially using the hard mask layer as an etching mask.

According to another embodiment of the invention, the first barrier is a thin film and a material thereof is, for example, oxide, nitride or oxynitride.

According to another embodiment of the invention, the second barrier is a thin film and a material thereof is, for example, oxide, nitride or oxynitride.

According to another embodiment of the invention, the first semiconductor layer/the second semiconductor layer/the third semiconductor layer is, for example, N+/P/N+ doped layer, P+/N/P+ doped layer or SiGe/Si/SiGe layer.

In another embodiment of the invention, the first conductive state is N-type, and the second conductive state is P-type. Alternatively, the first conductive state is P-type and the second conductive state is N-type.

According to another embodiment of the invention, a method of forming the storage structure is, for example, forming a first dielectric layer on the substrate to cover the surface of the active stacked structure, forming a storage layer to cover the first dielectric layer and then forming a second dielectric layer to cover the storage layer. The storage layer may be a charge-trapping layer, a floating gate or a nano-crystal. A material of the charge-trapping layer may be silicon nitride or a high dielectric constant material. A material of the nano-crystal may be silicon, germanium or metal nano-crystal.

In another embodiment of the invention, the first dielectric layer/the storage layer/the second dielectric layer may be ONO.

According to another embodiment of the invention, a method of forming the storage structure is, for example, orderly forming a first oxide layer (O1), a first nitride layer (N1), a second oxide layer (O2), a second nitride layer (N2) and a third oxide layer (O3) on the substrate so as to cover the active stacked structures.

In another embodiment of the invention, a material of the conductive layer is, for example, doped poly-silicon, metal silicide, ruthenium (Ru), molybdenum (Mo) or wolfram (W).

According to another embodiment of the invention, the substrate may be a silicon substrate, a silicon oxide substrate or a silicon nitride substrate.

Since a barrier is disposed between semiconductor layers, dopant in the semiconductor layers can be prevented from diffusing improperly in a subsequent thermal treatment. In addition, with the barriers, junction locations of the vertical non-volatile memory of the invention can be accurately controlled. Furthermore, the vertical non-volatile memory can be easily formed in the manufacturing method of the invention.

In order to make the aforementioned and other objects, features and advantages of the present invention more comprehensible, preferred embodiments accompanied with figures are described in detail below.

DESCRIPTION OF EMBODIMENTS

Please refer to the attached figures in the following disclosure so as to better describe the present invention. Several embodiments of the invention are illustrated in the figures. Nevertheless, the invention may be embodied in many different forms and should not be construed as limited to the embodiments set forth herein. In reality, the embodiments are provided to render the invention more explicit and complete and fully convey the scope of the invention to people ordinarily skilled in the art. For the purpose of clarity, the sizes and relative sizes of each of the layers and regions in the figures may be illustrated in exaggerated proportions correspondingly.

It should be known that the terminology used in the present disclosure adopts the first, the second and the third to describe each of the components, regions, layers and/or portions, but such terminology should not limit the components, regions, layers and/or portions. The terminology is only applied to differentiate a certain component, region, layer or portion from another component, region, layer or portion.

Figure 1:
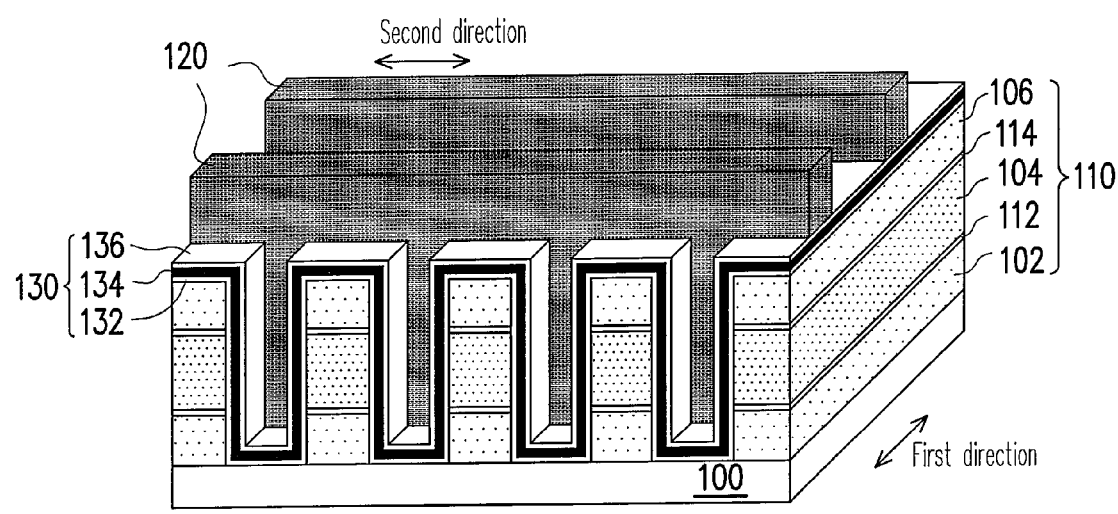
FIG. 1 is a schematic three-dimensional view of the vertical non-volatile memory according to the first embodiment of the present invention.

FIG. 1 is a schematic three-dimensional view of the vertical non-volatile memory according to the first embodiment of the present invention.

Referring to FIG. 1, a vertical non-volatile memory of the first embodiment of the invention includes a substrate 100, a plurality of strips of active stacked structures 110, a plurality of word lines 120 and a storage structure 130. The substrate 100 may be a silicon substrate, a silicon oxide substrate or a silicon nitride substrate. The active stacked structure 110 is disposed on the substrate 100 in parallel to a first direction. Each of the active stacked structures 110 includes a first semiconductor layer 102, a second semiconductor layer 104, a third semiconductor layer 106, a first barrier 112 and a second barrier 114. The first semiconductor layer 102 is disposed on the substrate 100. The second semiconductor layer 104 is disposed on the first semiconductor layer 102. The third semiconductor layer 106 is disposed on the second semiconductor layer 104. The first barrier 112 is disposed between the first and the second semiconductor layers 102 and 104. The second barrier 114 is disposed between the second and the third semiconductor layers 104 and 106.

Referring to FIG. 1, the first and the third semiconductor layers 102 and 106 have a first conductive state, whereas the second semiconductor layer 104 has a second conductive state. The first barrier 112 and the second barrier 114 are thin films, for example. And, materials of the first barrier 112 and the second barrier 114 are such as oxide, nitride or oxynitride, and the materials of the first and the second barriers 112 and 114 can be the same or different. Furthermore, thicknesses of the first and the second barriers 112 and 114 should be controlled within such a range that dopants in the first, the second and the third semiconductor layers 102, 104 and 106 are blocked from diffusing and direct tunneling of charges are prevented from being affected, such as within 10-20 angstroms. According to the first embodiment of the present invention, a structure of the first semiconductor layer 102/the second semiconductor layer 104/the third semiconductor layer 106 can be N+/P/N+ doped layer, P+/N/P+ doped layer or SiGe/Si/SiGe layer. The first semiconductor layer 102, the second semiconductor layer 104 and the third semiconductor layer 106 may be poly-silicon layers. The first conductive state can be N-type, and the second conductive state can be P-type. Alternatively, the first conductive state is P-type, and the second conductive state is N-type.

Referring to FIG. 1 again, the word lines 120 are arranged in parallel to a second direction. Each of the word lines 120 crosses the active stacked structures 110 and fills spaces among the active stacked structures 110. The storage structure 130 is disposed between the word lines 120 and the active stacked structures 110. The storage structure 130 includes a first dielectric layer 132, a storage layer 134 and a second dielectric layer 136. The first dielectric layer 132 covers a surface of the active stacked structures 110; the storage layer 134 covers the first dielectric layer 132 and the second dielectric layer 136 covers the storage layer 134. The storage layer 134 may be a charge-trapping layer, a floating gate or a nano-crystal. When the storage layer 134 is a charge-trapping layer, a material thereof can be chosen among silicon nitride or other high dielectric constant materials. When the storage layer 134 is a nano-crystal, a material thereof can be silicon, germanium or metal nano-crystal. According to the first embodiment, the first dielectric layer 132/the storage layer 134/the second dielectric layer 136 of the storage structure 130 is oxide-nitride-oxide (ONO). A material of the word lines 120 is, for example, doped poly-silicon, metal silicide, ruthenium (Ru), molybdenum (Mo) or wolfram (W).

FIGS. 2A through 2L are schematic cross-sectional views illustrating a manufacturing process flowchart of the non-volatile memory according to the second embodiment of the invention.

Figure 2A:
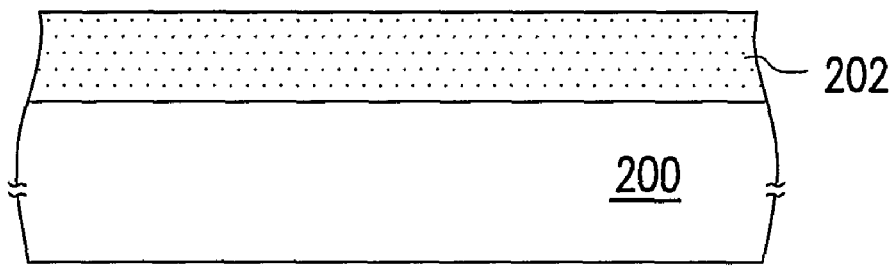
FIGS. 2A through 2L are schematic cross-sectional views illustrating a manufacturing process of the non-volatile memory according to the second embodiment of the invention.

Referring to FIG. 2A, the manufacturing method in the second embodiment includes forming a first semiconductor layer 202 on a substrate 200. The first semiconductor layer 202 has a first conductive state. The substrate 200 may be a silicon substrate, a silicon oxide substrate or a silicon nitride substrate. A method of forming the first semiconductor layer 202 is, for example, depositing a high dosage N-type poly-silicon layer (an N+ poly Si layer).

Figure 2B:
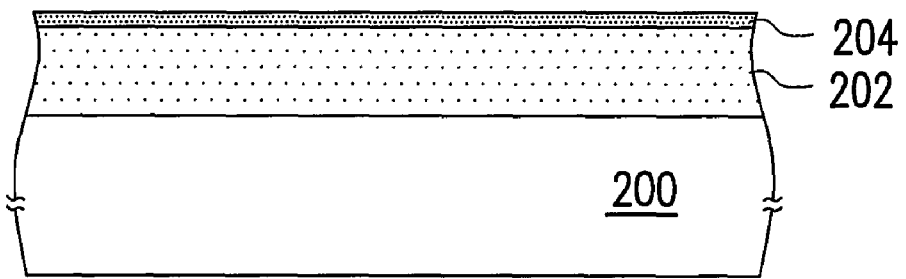

Afterwards, referring to FIG. 2B, a thin-film-like first barrier 204 is formed on the first semiconductor layer 202, and a material of the first barrier 204 may be oxide, nitride or oxynitride.

Figure 2C:
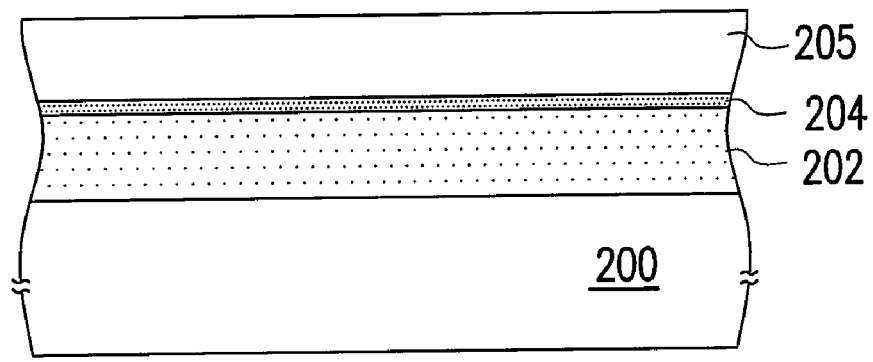

Next, referring to FIG. 2C, a poly-silicon layer 205 is first deposited to form a second semiconductor layer on the first barrier 204 so as to form subsequently a second semiconductor layer.

Figure 2D:
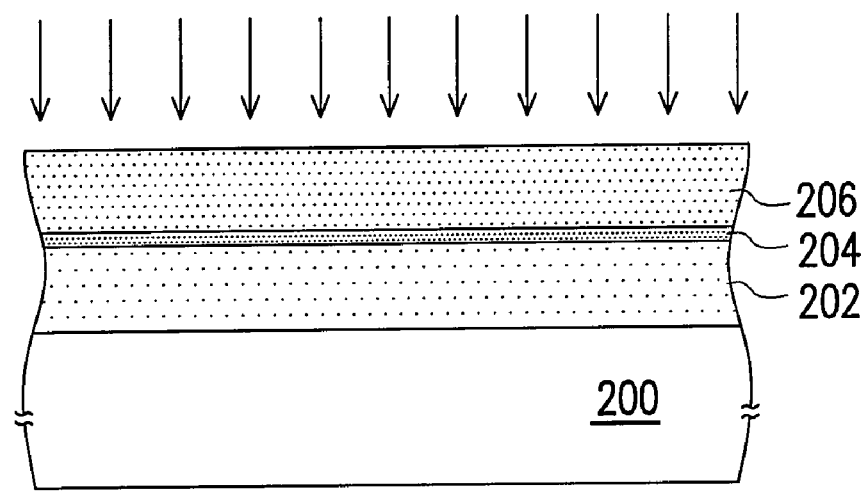

Referring to FIG. 2D, a P-type dopant is injected into the poly-silicon layer 205 to form a second semiconductor layer 206 having a second conductive state. It should be known to people skilled in the art of the present invention that the first conductive state can be N-type, and the second conductive state can be P-type. Alternatively, the first conductive state is P-type and the second conductive state is N-type.

Figure 2E:
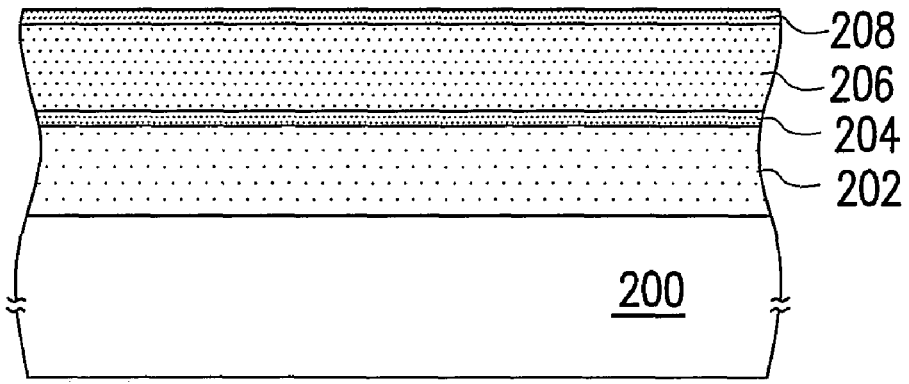

Thereafter, referring to FIG. 2E, a thin-film-like second barrier 208 is formed on the second semiconductor layer 206, and a material of the second barrier 208 may be oxide, nitride or oxynitride.

Figure 2F:
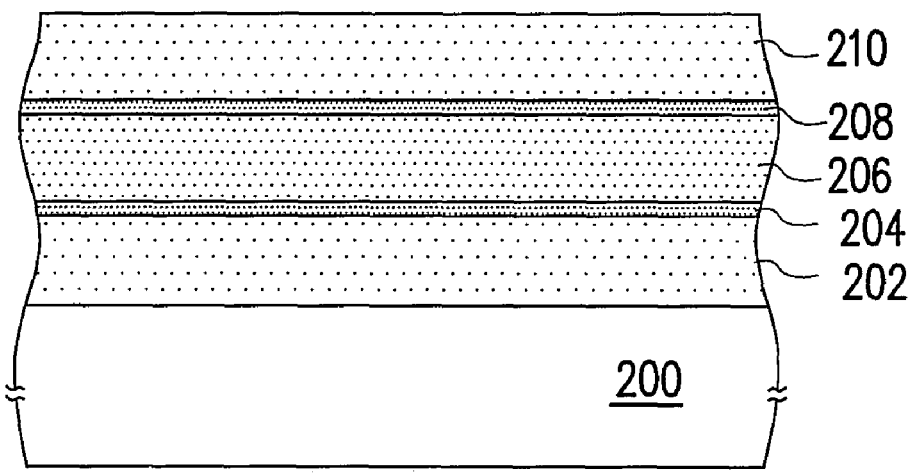

Referring to FIG. 2F, a third semiconductor layer 210 is formed on the second barrier 208, and the third semiconductor layer 210 has the same first conductive state as the first semiconductor layer 202. A method of forming the third semiconductor layer 210 is, for example, depositing a high dosage N-type poly-silicon layer (an N+ poly Si layer).

According to the second embodiment of the invention, the first semiconductor layer 202/the second semiconductor layer 206/the third semiconductor layer 210 is, for example, N+/P/N+ doped layer, P+/N/P+ doped layer or SiGe/Si/SiGe layer.

Figure 2G:
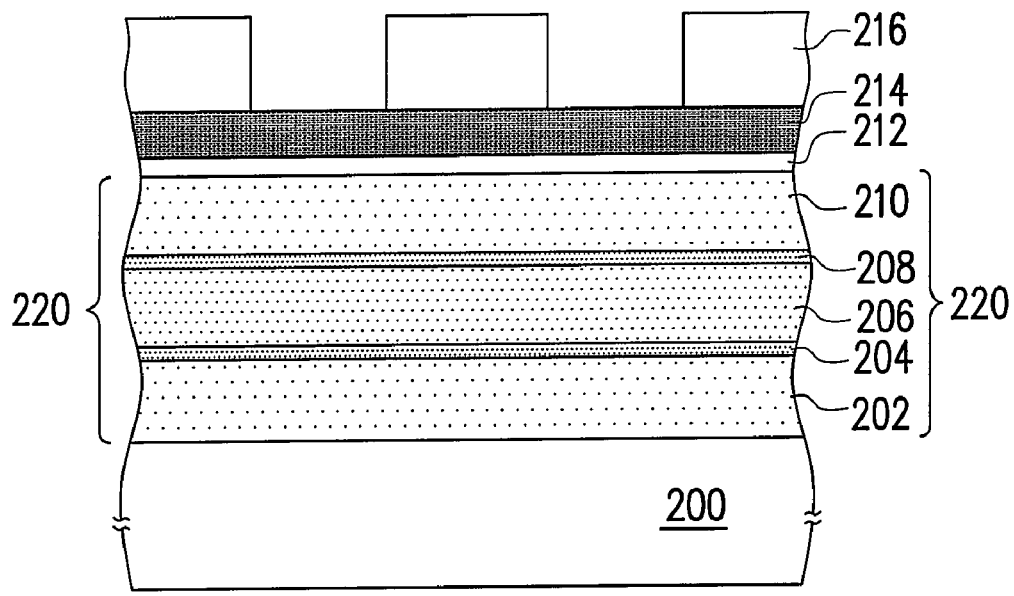

Referring to FIG. 2G, in order to form a plurality of strips of active stacked structures, a pad oxide layer 212 may be first formed on the third semiconductor layer 210, and a hard mask layer 214 is further formed on the pad oxide layer 212. Afterwards, a patterned photoresist layer 216 is formed on the hard mask layer 214 by a photolithographic process and an etching process.

Figure 2H:
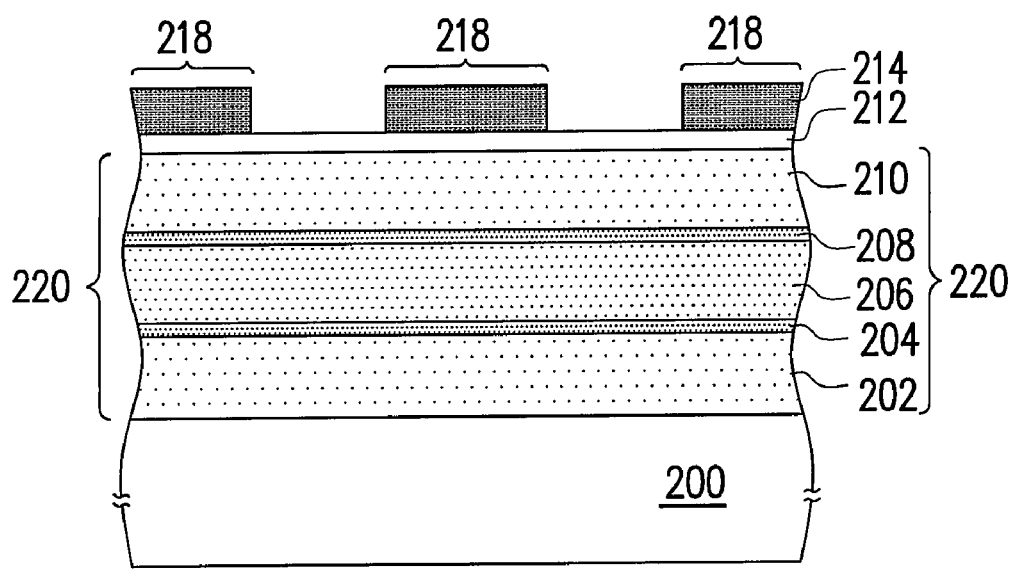

Referring to FIG. 2H, the hard mask layer 214 is etched using the patterned photoresist layer 216 as an etching mask so as to define a plurality of strips of active stacked structure regions 218 in the hard mask layer 214 so that a portion of the pad oxide layer 212 is exposed. Finally, the patterned photoresist layer 216 is completely removed.

Figure 2I:
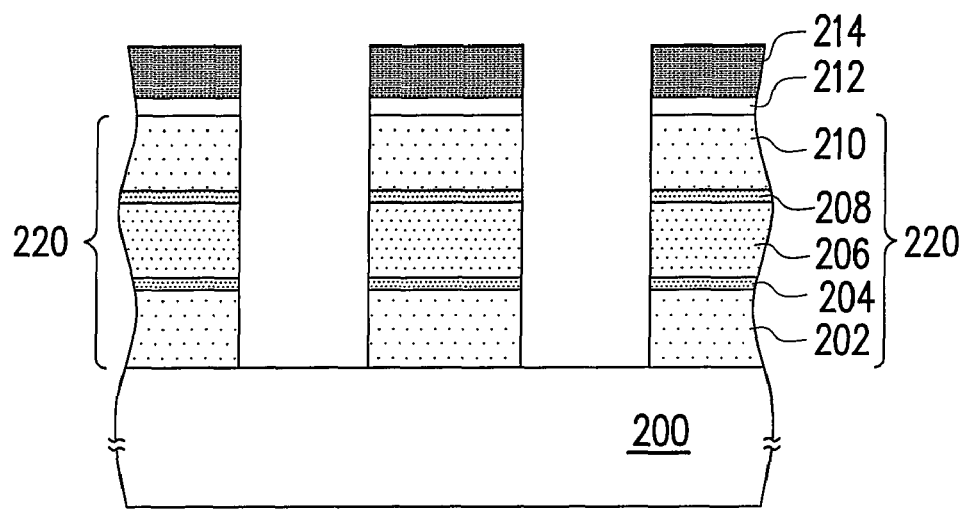

Thereafter, referring to FIG. 2I, the exposed pad oxide layer 212 is removed first by etching with the hard mask layer 214 as an etching mask. Then, portions of the third semiconductor layer 210, the second barrier 208, the second semiconductor layer 206, the first barrier 204 and the first semiconductor layer 202 are sequentially removed to form a plurality of strips of active stacked structures 220.

Figure 2J:
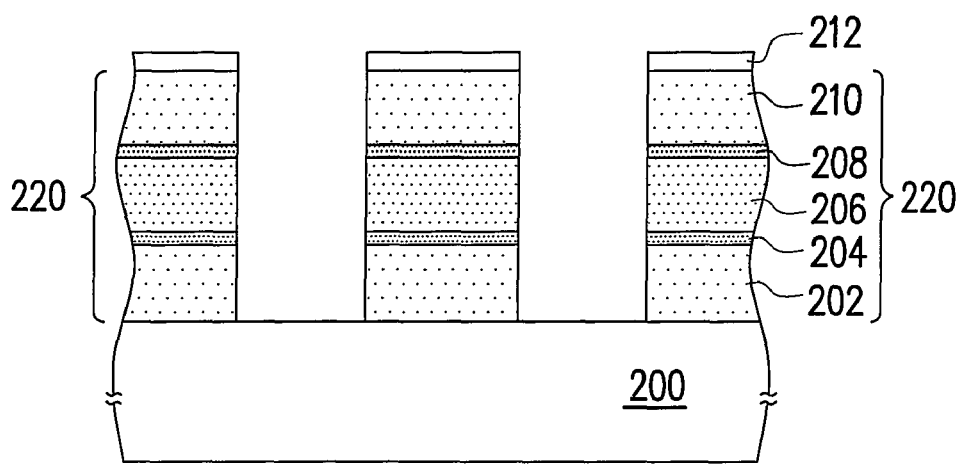

Referring to FIG. 2J, the hard mask layer 214 as illustrated in FIG. 2I may be removed first, and the pad oxide layer 212 be retained if necessary.

Figure 2K:
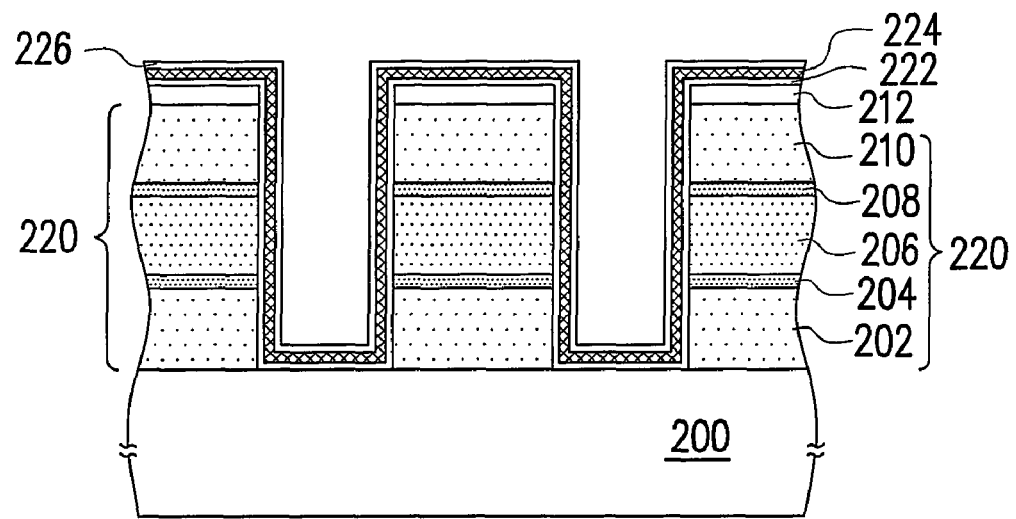

Next, referring to FIG. 2K, a first dielectric layer 222 is formed on the substrate 200 to cover a surface of an active stacked structure 220. The first dielectric layer 222 is covered with a storage layer 224, and then the storage layer 224 is covered with a second dielectric layer 226. The storage layer 224 is, for example, a charge-trapping layer, a floating gate or a nano-crystal. A material of the charge-trapping layer may be silicon nitride or a high dielectric constant material, and a material of the nano-crystal may be silicon, germanium or metal nano-crystal. According to the second embodiment, the first dielectric layer 222/the storage layer 224/the second dielectric layer 226 may be ONO so as to manufacture a vertical non-volatile memory in which every single memory cell stores two bits.

Figure 2L:
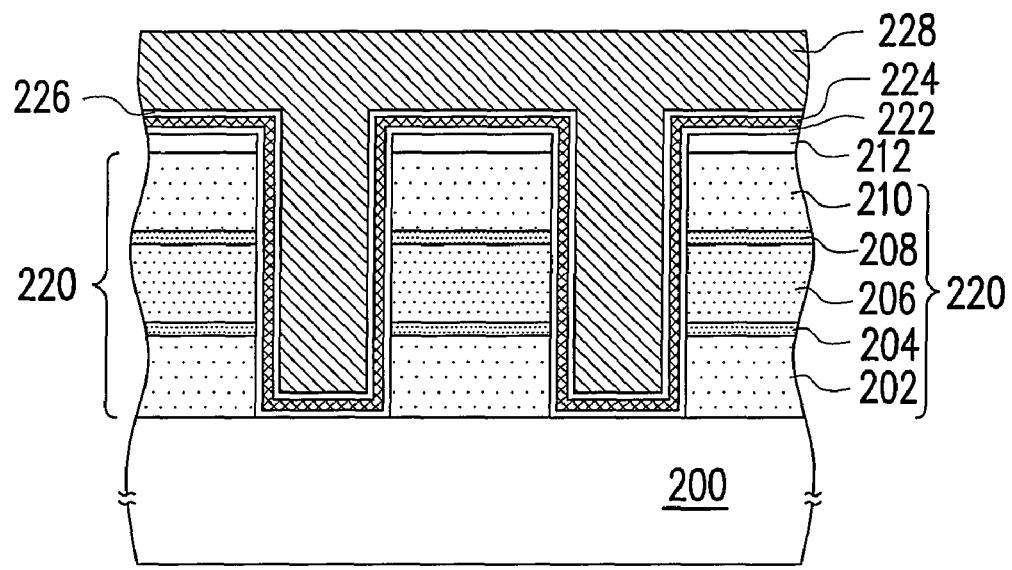

Referring to FIG. 2L, a conductive layer 228 is formed on the substrate 200 to cover the second dielectric layer 226 and fill spaces among the active stacked structures 220. A material of the conductive layer 228 is, for example, doped poly-silicon, metal silicide, ruthenium (Ru), molybdenum (Mo) or wolfram (W). Lastly, a portion of the conductive layer 228 is removed to form a plurality of word lines. The word lines cross the active stacked structures 220 (as 110 in FIG. 1) as the word lines 120 illustrated in FIG. 1.

Figure 3:
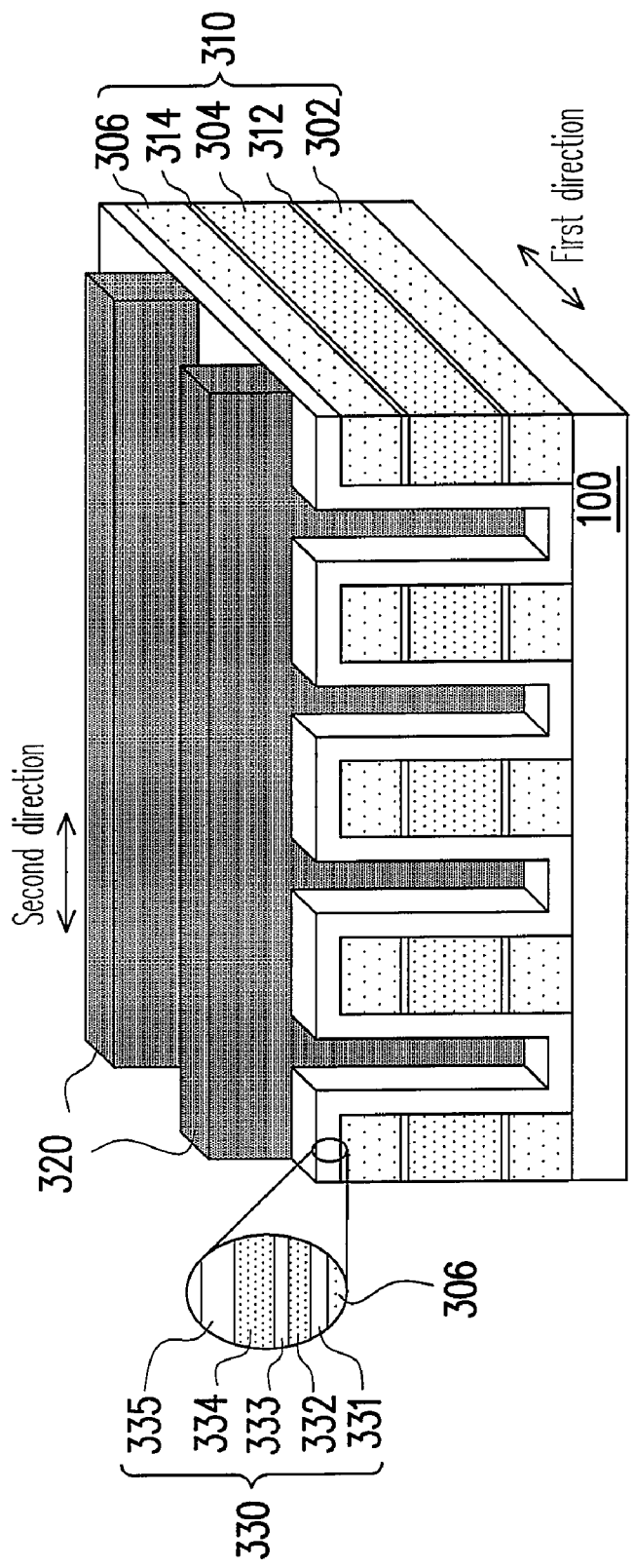
FIG. 3 is a schematic three-dimensional view of the vertical non-volatile memory according to the third embodiment of the present invention.

FIG. 3 is a schematic three-dimensional view of the vertical non-volatile memory according to the third embodiment of the present invention. The vertical non-volatile memory is a kind of BE-SONOS (bandgap engineered SONOS) memory.

Referring to FIG. 3, the vertical non-volatile memory of the third embodiment of the invention includes a substrate 300, a plurality of strips of active stacked structures 310, a plurality of word lines 320 and a storage structure 330. Each of the active stacked structures 310 includes a first semiconductor layer 302, a second semiconductor layer 304, a third semiconductor layer 306, a first barrier 312 and a second barrier 314. Furthermore, thicknesses of the first and the second barriers 312 and 314 should be controlled within such a range that dopants in the first, the second and the third semiconductor layers 302, 304 and 306 are blocked from diffusing and direct tunneling of charges are prevented from being affected, such as within 10-20 angstroms.

Referring to FIG. 3 again, the arrangements, positions and materials of the layers and structures in the third embodiment are similar to or the same as those in the first embodiment of the present invention. Additionally, the difference between the first and the third embodiments is the storage structure 330 therein. The storage structure 330 includes, for example, a first oxide layer (O1) 331, a first nitride layer (N1) 332, a second oxide layer (O2) 333, a second nitride layer (N2) 334 and a third oxide layer (O3) 335 covering the active stacked structures 310 orderly. A thickness of an O1\N1\O2 in the storage structure needs to be controlled as very thin so that a force of an exterior voltage can be used to control entry and exit of electrons and holes. For example, thicknesses of the first and the second oxide layer and the first nitride layer are independently less than 2 nm, and preferably, the thickness of the first oxide layer (O1) 331 is between 0.5 nm and 2 nm, and the thickness of the first nitride layer (N1) 332 is between 1 nm and 2 nm, and the thickness of the second oxide layer (O2) 333 is between 1.5 nm and 2 nm. More preferably, the thickness of the first oxide layer (O1) 331 is less than 1.5 nm.

Figure 4A:
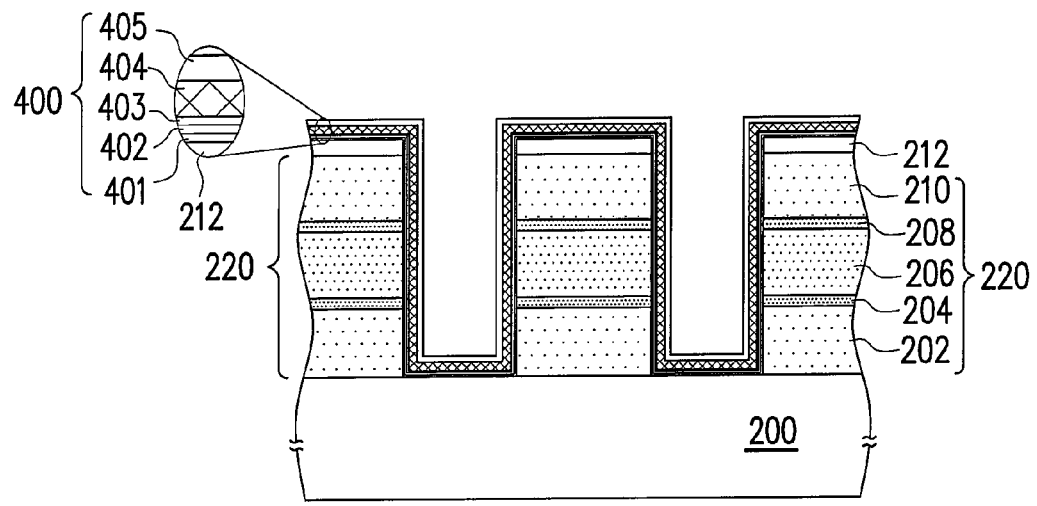
FIGS. 4A through 4B are schematic cross-sectional views illustrating a back-end manufacturing process of the vertical non-volatile memory in FIG. 3.
Figure 4B:
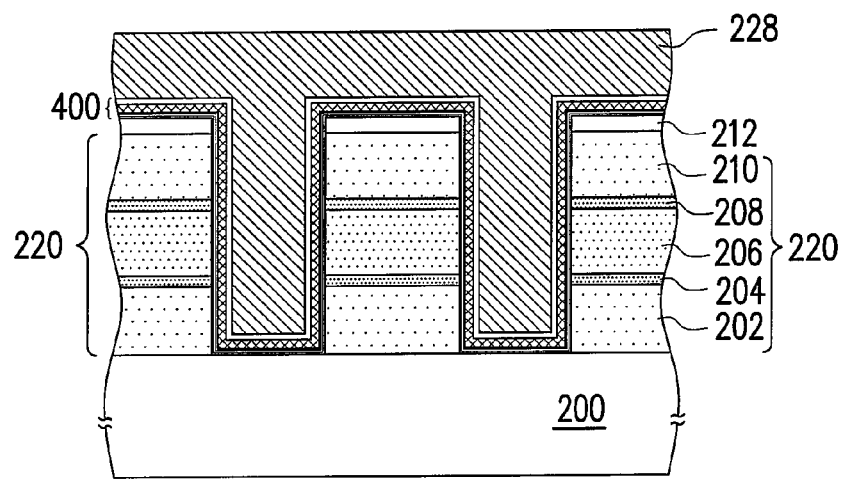

FIGS. 4A through 4B are schematic cross-sectional views illustrating a back-end manufacturing process of the non-volatile memory in FIG. 3. For the preceding manufacturing process of the vertical non-volatile memory in FIG. 3, please refer to FIGS. 2A through 2J in the second embodiment of the present invention. The same element reference labels in FIGS. 4A and 4B represent the same or similar elements as those in FIGS. 2A through 2J.

Referring to FIG. 4A, a first oxide layer (O1) 401 is formed on the substrate 200 to cover a surface of an active stacked structure 220 after forming the active stacked structures 220. The first oxide layer (O1) 401 is covered with a first nitride layer (N1) 402, and then the first nitride layer (N1) 402 is covered with a second oxide layer (O2) 403. The second oxide layer (O2) 403 is covered with a second nitride layer (N2) 404, and then the second nitride layer (N2) 404 is covered with a third oxide layer (O3) 405. The formation of the storage structure 400 consisting of O1\N1\O2\N2\O3 is finished.

Next, referring to FIG. 4B, a conductive layer 228 is formed on the substrate 200 to cover the third oxide layer (O3) 405 and fill spaces among the active stacked structures 220. A material of the conductive layer 228 is, for example, doped poly-silicon, metal silicide, ruthenium (Ru), molybdenum (Mo) or wolfram (W). Lastly, a portion of the conductive layer 228 is removed to form a plurality of word lines.

In conclusion, since the barriers in the structure of the present invention are used as barriers among the semiconductor layers serving as the source, the drain and the channel region, the dopant in the semiconductor layers is prevented from diffusing improperly in a subsequent thermal treatment. In addition, with existence of the barriers in the vertical non-volatile memory of the present invention, junction locations in the vertical non-volatile memory are accurately controlled. Furthermore, a vertical non-volatile memory can be easily fabricated in the manufacturing method disclosed by the present invention.

Although the present invention has been disclosed above by the embodiments, they are not intended to limit the present invention. Anybody ordinarily skilled in the art can make some modifications and alterations without departing from the spirit and scope of the present invention. Therefore, the protecting range of the present invention falls in the appended claims.

What is claimed is:

1. A vertical non-volatile memory, comprising:
a substrate;
a plurality of strips of active stacked structures disposed on the substrate in parallel to a first direction, wherein each of the active stacked structures comprises:
a first semiconductor layer disposed on the substrate and having a first conductive state;
a second semiconductor layer disposed on the first semiconductor layer and having a second conductive state;
a third semiconductor layer disposed on the second semiconductor layer and having the first conductive state;
a first dopant barrier disposed between the first semiconductor layer and the second semiconductor layer; and
a second dopant barrier disposed between the second semiconductor layer and the third semiconductor layer;
a plurality of word lines arranged in parallel to a second direction, wherein each of the word lines crosses the active stacked structures and fills spaces among the active stacked structures; and
a storage structure disposed between the word lines and the active stacked structures and conformally disposed on the active stacked structures and the substrate,
wherein the first semiconductor layers of the active stacked structures are not mutually electrically connected.

2. The vertical non-volatile memory of claim 1, wherein the first dopant barrier is a thin film and a material thereof comprises oxide, nitride or oxynitride.

3. The vertical non-volatile memory of claim 2, wherein a thickness of the first dopant barrier is 10-20 angstroms.

4. The vertical non-volatile memory of claim 1, wherein the second dopant barrier is a thin film and a material thereof comprises oxide, nitride or oxynitride.

5. The vertical non-volatile memory of claim 4, wherein a thickness of the second dopant barrier is 10-20 angstroms.

6. The vertical non-volatile memory of claim 1, wherein a structure of the first semiconductor layer/the second semiconductor layer/the third semiconductor layer comprises N+/P/N+ doped layer, P+/N/P+ doped layer or SiGe/Si/SiGe layer.

7. The vertical non-volatile memory of claim 1, wherein the first semiconductor layer, the second semiconductor layer and the third semiconductor layer comprise poly-silicon layers.

8. The vertical non-volatile memory of claim 1, wherein the first conductive state is N-type and the second conductive state is P-type.

9. The vertical non-volatile memory of claim 1, wherein the first conductive state is P-type and the second conductive state is N-type.

10. The vertical non-volatile memory of claim 1, wherein the storage structure comprises:
a first dielectric layer covering a surface of the active stacked structures;
a storage layer covering the first dielectric layer; and
a second dielectric layer covering the storage layer.

11. The vertical non-volatile memory of claim 10, wherein the storage layer comprises a charge-trapping layer, a floating gate or a nano-crystal.

12. The vertical non-volatile memory of claim 11, wherein a material of the charge-trapping layer comprises silicon nitride or a high dielectric constant material.

13. The vertical non-volatile memory of claim 11, wherein a material of the nano-crystal comprises silicon, germanium or metal nano-crystal.

14. The vertical non-volatile memory of claim 10, wherein the first dielectric layer/the storage layer/the second dielectric layer of the storage structure comprises oxide-nitride-oxide (ONO).

15. The vertical non-volatile memory of claim 1, wherein the storage structure comprises:
a first oxide layer (O1) covering a surface of the active stacked structures;
a first nitride layer (N1) covering the first oxide layer (O1);
a second oxide layer (O2) covering the first nitride layer (N1);
a second nitride layer (N2) covering the second oxide layer (O2); and
a third oxide layer (O3) covering the second nitride layer (N2).

16. The vertical non-volatile memory of claim 15, wherein a thickness of the first oxide layer (O1) is less than 2 nm.

17. The vertical non-volatile memory of claim 16, wherein the thickness of the first oxide layer (O1) is between 0.5 nm and 2 nm.

18. The vertical non-volatile memory of claim 16, wherein the thickness of the first oxide layer (O1) is less than 1.5 nm.

19. The vertical non-volatile memory of claim 15, wherein a thickness of the first nitride layer (N1) is less than 2 nm.

20. The vertical non-volatile memory of claim 19, wherein the thickness of the first nitride layer (N1) is between 1 nm and 2 nm.

21. The vertical non-volatile memory of claim 15, wherein a thickness of the second oxide layer (O2) is less than 2 nm.

22. The vertical non-volatile memory of claim 21, wherein the thickness of the second oxide layer (O2) is between 1.5 nm and 2 nm.

23. The vertical non-volatile memory of claim 1, wherein a material of the word lines comprises doped poly-silicon, metal silicide, ruthenium (Ru), molybdenum (Mo) or wolfram (W).

24. The vertical non-volatile memory of claim 1, wherein the substrate comprises a silicon substrate, a silicon oxide substrate or a silicon nitride substrate.

* * * * *